(12) United States Patent
Huang et al.

(10) Patent No.: US 8,604,503 B2
(45) Date of Patent: Dec. 10, 2013

(54) LIGHT EMITTING DIODE AND MANUFACTURING METHOD THEREOF

(75) Inventors: Chia-Hung Huang, Hsinchu (TW); Shih-Cheng Huang, Hsinchu (TW); Po-Min Tu, Hsinchu (TW); Ya-Wen Lin, Hsinchu (TW); Shun-Kuei Yang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/600,137

(22) Filed: Aug. 30, 2012

(65) Prior Publication Data

US 2013/0234150 A1     Sep. 12, 2013

(30) Foreign Application Priority Data

Mar. 6, 2012    (CN) .......................... 2012 1 0055984

(51) Int. Cl.
*H01L 33/22* (2010.01)

(52) U.S. Cl.
USPC ................................ 257/98; 257/13; 438/29

(58) Field of Classification Search
CPC ....................................................... H01L 33/22
See application file for complete search history.

(56) References Cited

U.S. PATENT DOCUMENTS

| | | | |
|---|---|---|---|
| 6,781,160 B1 * | 8/2004 | Tsai et al. | 257/98 |
| 8,198,649 B2 * | 6/2012 | Kim et al. | 257/103 |
| 2007/0241352 A1 * | 10/2007 | Yasuda et al. | 257/94 |
| 2011/0150017 A1 * | 6/2011 | Chua et al. | 372/45.01 |
| 2011/0186856 A1 * | 8/2011 | Huang et al. | 257/76 |
| 2011/0198590 A1 * | 8/2011 | Preble et al. | 257/49 |
| 2011/0254135 A1 * | 10/2011 | Toba et al. | 257/615 |
| 2013/0032779 A1 * | 2/2013 | Huang et al. | 257/13 |

* cited by examiner

*Primary Examiner* — Thomas L Dickey
*Assistant Examiner* — Joseph Schoenholtz
(74) *Attorney, Agent, or Firm* — Altis Law Group, Inc.

(57) ABSTRACT

A light emitting diode includes a substrate, a transitional layer on the substrate and an epitaxial layer on the transitional layer. The transitional layer includes a planar area with a flat top surface and a patterned area with a rugged top surface. An AlN material includes a first part consisting of a plurality of spheres and a second part consisting of a plurality of slugs. The spheres are on a top surface of the transitional layer, both at the planar area and the patterned area. The slugs are in grooves defined in the patterned area. Air gaps are formed between the slugs and a bottom surface of the epitaxial layer. The spheres and slugs of the AlN material help reflection of light generated by the epitaxial layer to a light output surface of the LED.

20 Claims, 8 Drawing Sheets

LIGHT EMITTING DIODE AND MANUFACTURING METHOD THEREOF

BACKGROUND

1. Technical Field

The disclosure relates to LEDs (light emitting diodes), and more particularly to an LED with high light emitting efficiency and a manufacturing method of the LED.

2. Description of the Related Art

LEDs have low power consumption, high efficiency, quick reaction time, long lifetime, and the absence of toxic elements such as mercury during manufacturing. Due to those advantages, traditional light sources are gradually replaced by LEDs. LEDs are capable of converting electrons into photons to emit radiant light at a certain spectrum out of the LEDs. The LEDs each include a substrate for disposing a light emitting layer. However, a part of radiant light emitted from the light emitting layer may be absorbed by the substrate, which is located under the light emitting layer. Such that, a light emitting intensity of the LED may be reduced.

Therefore, an LED and a manufacturing method of the LED that overcome aforementioned deficiencies are required.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present mounting apparatus for storage device. Moreover, in the drawings, like reference numerals designate corresponding parts throughout the views.

DETAILED DESCRIPTION

Figure 1:
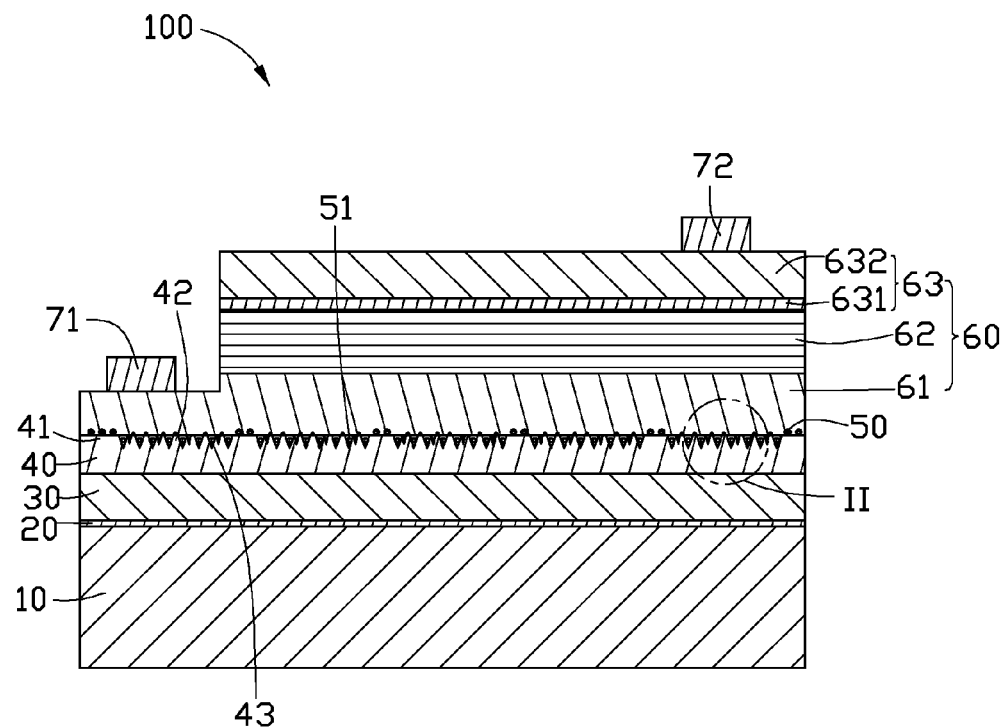
FIG. 1 is a cross-sectional view of an LED in accordance with an embodiment of the disclosure.
Figure 2:
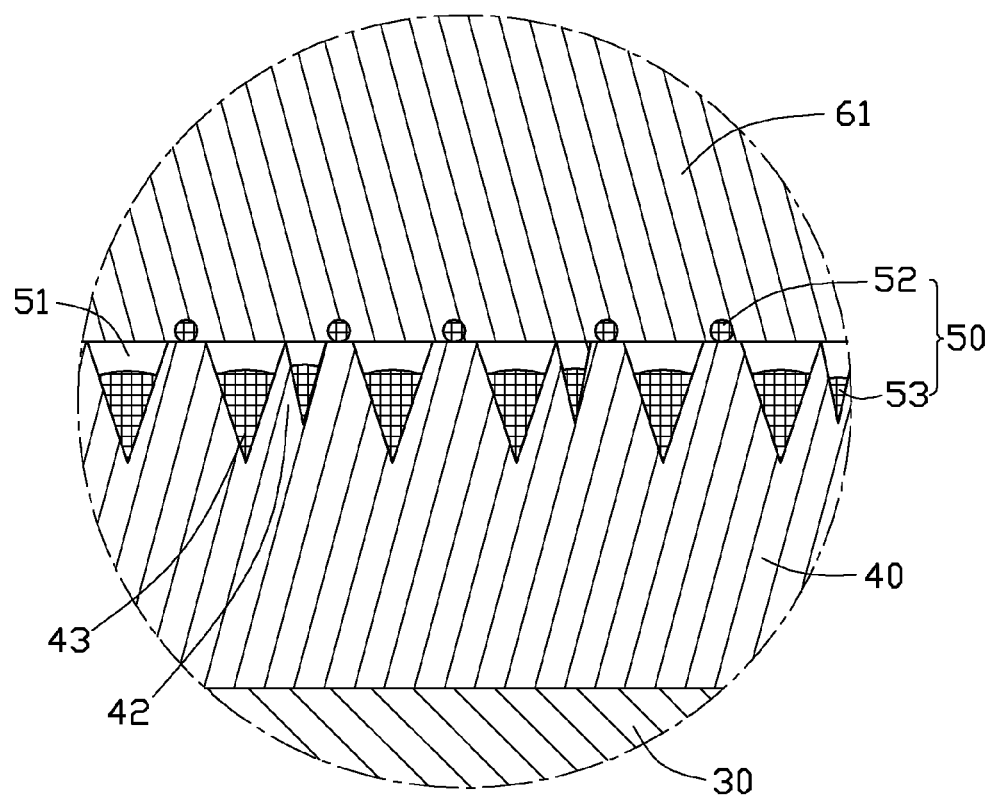
FIG. 2 is an enlarged view of a circled portion II of the LED of FIG. 1.

Referring to FIG. 1 and FIG. 2, an LED 100 in accordance with one embodiment of the disclosure includes a substrate 10, a buffer layer 20 disposed on the substrate 10, a first transitional layer 30 disposed on the buffer layer 20, a second transitional layer 40 disposed on the first transitional layer 30, an aluminum nitride (AlN) material 50, and an epitaxial layer 60 disposed on the second transitional layer 40 and covering the AlN material 50.

In the embodiment, the substrate 10 is made of sapphire ($Al_2O_3$). Alternatively, the substrate 10 also can be made of silicon carbide (SiC), silicon or gallium nitride (GaN).

The buffer layer 20, the first transitional layer 30 and the second transitional layer 40 are sequentially disposed on the substrate 10, by metal-organic chemical vapor deposition (MOCVD), molecular beam epitaxy (MBE) or hydride vapor phase epitaxy (HVPE). In this embodiment, the first transitional layer 30 and the second transitional layer 40 are made of un-doped GaN. Specifically, a top surface of the first transitional layer 30 is smooth and flat. A top surface of the second transitional layer 40 is rugged. The rugged top surface of the second transitional layer 40 includes a planar area 41 and a patterned area 42 alternant with the planar area 41. The patterned area 42 includes a plurality of protrusions. A groove 43 is defined between every two adjacent protrusions.

The AlN material 50 is located between the second transitional layer 40 and the epitaxial layer 60. The AlN material 50 includes a first part 52 consisting of a plurality of spheres discretely formed in a bottom of the epitaxial layer 60 and on a top face of the second transitional layer 40 and a second part 53 consisting of a plurality of slugs discretely formed in the second transitional layer 40. The spheres of the first part 52 are separated from the slugs of the second part 53 in the patterned area 42, wherein at least one slug is located between two neighboring spheres of the first part 52. At the planar area 41, there is no the second part 53 of the AlN material 50; only the first part 52 of the AlN material 50 exists at the planar area 41. The spheres of the first part 52 at the planar area 41 are separated from each other. Alternatively, the first part 52 can consist of a plurality of pyramidal or cylindrical masses. The slugs of the second part 53 are in the grooves 43 of the patterned area 42. Each slug of the second part 53 is fittingly received in a corresponding groove 43 and has a shape matching with a shape of the corresponding groove 43. The second part 53 of the AlN material 50 does not completely fill the grooves 43, such that the second part 53 of the AlN material 50 in the grooves 43 is spaced from the epitaxial layer 60 by a gap 51 in each groove 43.

The epitaxial layer 60 includes a first semiconductor layer 61, a light emitting layer 62 and a second semiconductor layer 63 sequentially disposed on the second transitional layer 40. The first semiconductor layer 61 receives the first part 52 therein. The first semiconductor layer 61 is located on the planar area 41 and the patterned area 42 of the second transitional layer 40, and spaced from the second part 53 in the grooves 43 by the gaps 51. In this embodiment, the first semiconductor layer 61 is an N-type GaN layer, the light emitting layer 62 is a multiple quantum well (MQW) GaN/InGaN layer, and the second semiconductor layer 63 is a P-type GaN layer. The second semiconductor layer 63 includes a P-type blocking layer 631 on the light emitting layer 62 and a P-type contacting layer 632 on the P-type blocking layer 631. In this embodiment, the P-type blocking layer 631 is made of P-type aluminum gallium nitride (AlGaN), and the P-type contacting layer 632 is made of P-type GaN. When electrons inside the first semiconductor layer 61 jump to electric holes inside the second semiconductor layer 63 by excitation of an electric field, photons are emitted from the light emitting layer 62 where the conjunctions of the electrons and the electric holes occur. The AN material 50 reflects a part of radiant light emitted from the light emitting layer 62 facing the substrate 10, and then directs the radiant light out of the LED 100 in a normal direction, which is directly out of a top surface of the LED 100. Thus, a light emitting efficiency of the LED 100 can be enhanced.

The LED 100 further includes a first electrode 71 and a second electrode 72. The first electrode 71 is disposed on a part of the first semiconductor layer 61 which is exposed upwardly. The second electrode 72 is disposed on a top surface of the P-type contacting layer 632 of the second semiconductor layer 63. The first and second electrodes 71, 72 direct an inducting current into and out of the LED 100 for producing the electric field. In this embodiment, the first electrode 71 is a cathode and the second electrode 72 is an anode. In addition, a transparent conductive layer (not shown) can be formed between the second electrode 72 and the second semiconductor layer 63 for evenly inducting current into the LED 100. The transparent conductive layer can be made of indium tin oxide (ITO) or an alloy of nickel and gold (Ni/Au).

Figure 3:
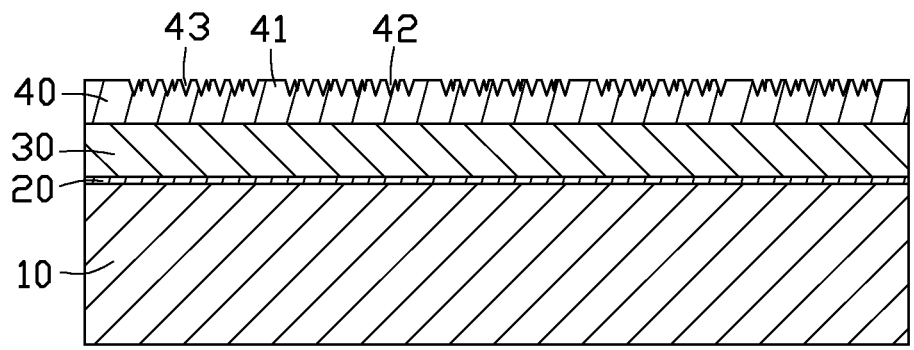
FIG. 3 is a cross-sectional view showing a step of providing a substrate and two transitional layers sequentially disposed on the substrate in accordance with a manufacturing method of the LED of the disclosure.

The disclosure provides a manufacturing method for the LED 100 which includes following steps:

Referring to FIG. 3, a substrate 10 is provided. In this embodiment, the substrate 10 is made of sapphire ($Al_2O_3$). Alternatively, the substrate 10 can also be made of SiC, silicon or GaN.

Thereafter, a buffer layer 20, a first transitional layer 30 and a second transitional layer 40 are sequentially formed on the substrate 10 by metal-organic chemical vapor deposition (MOCVD), molecular beam epitaxy (MBE) or hydride vapor phase epitaxy (HVPE). In this embodiment, the first transitional layer 30 and the second transitional layer 40 are un-doped GaN layers. The first transitional layer 30 is formed at a temperature from 1000 to 1200 degrees centigrade (t), and the second transitional payer 40 is formed at a temperature from 700 to 900° C. In this embodiment, the temperature for forming the first transitional layer 30 is 1150 degrees centigrade, and the temperature for forming the second transitional payer 40 is 850 degrees centigrade. The top surface of the first transitional layer 30 is smooth and flat, and the top surface of the second transitional layer is rugged. The rugged top surface of the second transitional layer 40 includes a planar area 41 and a patterned area 42. The patterned area 42 includes a plurality of protrusions, and at least a groove 43 is defined between every two adjacent protrusions.

Figure 4:
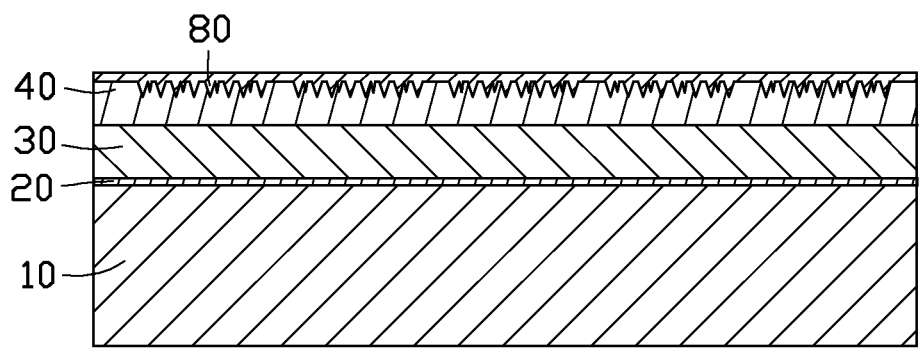
FIG. 4 is a cross-sectional view showing a step of coating an aluminum layer on the transitional layers of FIG. 3.

Referring to FIG. 4, an aluminum layer 80 is coated on the top surface of the second transitional layer 40. In this embodiment, the aluminum layer 80 can be formed by vapor deposition vapor deposition, evaporation or sputtering; a thickness of the aluminum layer 80 is 500 A.

Figure 5:
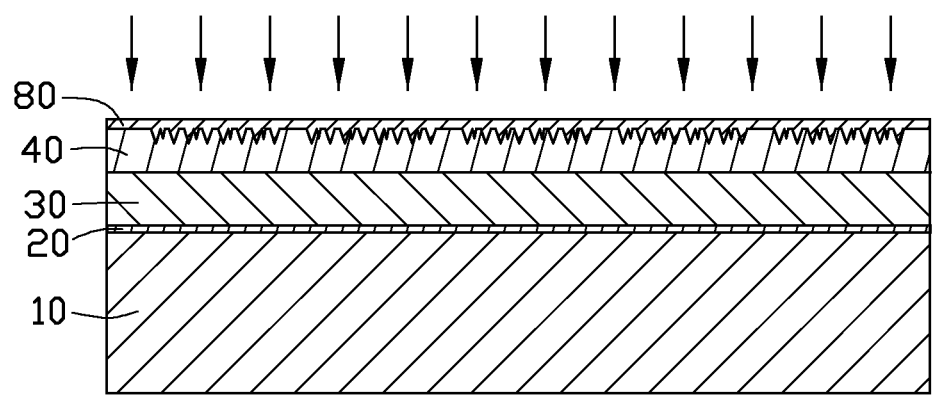
FIG. 5 to FIG. 7 are cross-sectional views showing steps of forming different elements in sequence on the aluminum nitride layer of FIG. 4.

Referring to FIG. 5, an outer surface of the aluminum layer 80 is subjected to a nitrogen treatment. In this embodiment, the nitriding process is achieved by MOCVD, and a temperature in nitriding the aluminum layer 80 is about 700° C. In the nitriding process, when the aluminum layer 80 is heated at a temperature of about 660° C., the aluminum layer 80 is melted, with a part thereof on the planar area 41 being turned into a plurality of aluminum spheres and another part thereof on the patterned area 42 flowing into the grooves 43; when the aluminum layer 80 is heated at a temperature of about 700° C., ammonia ($NH_3$) gas is infused over the melted aluminum layer 80, and reacts with the melted aluminum layer 80 to form AlN material 50. Such that, the AlN material 50 includes a first part 52 located on the planar area 41 and the patterned area 42, and a second part 53 located at the patterned area 42 only. The first part 52 consists of a plurality of spaced spheres, and a diameter of each sphere is from 50 to 100 nm. The second part 53 consists of a plurality of slugs conformably received in the grooves 43, respectively, without completely filling the grooves 43.

Figure 6:
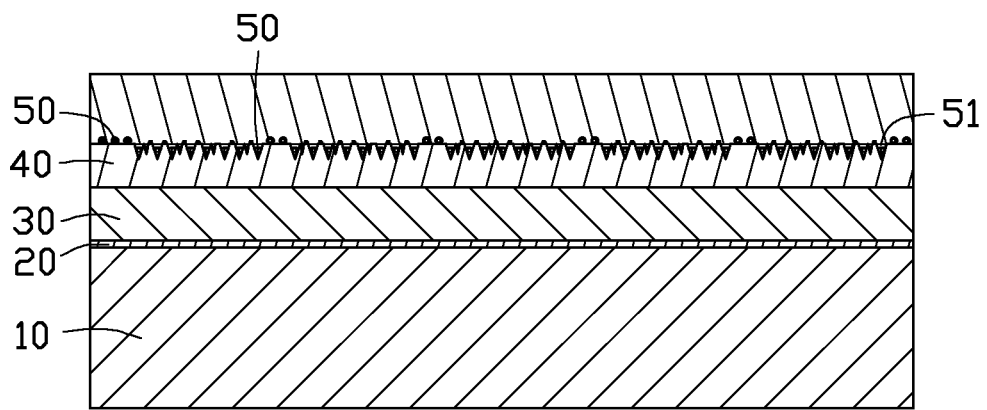
Figure 7:
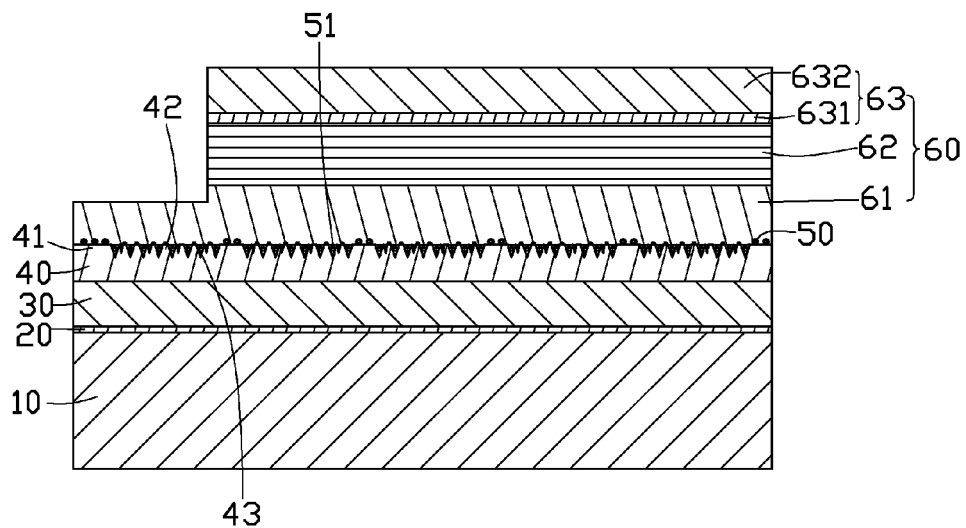

Referring to FIG. 6 and FIG. 7, an epitaxial layer 60 is formed on the second transitional layer 40 and cover the AlN material 50. The epitaxial layer 60 includes a first semiconductor layer 61, a light emitting layer 62, and a second semiconductor layer 63 sequentially disposed on the second transitional layer 40.

The epitaxial layer 60 can be formed by MOCVD, MBE, or HYPE. In this embodiment. The first semiconductor layer 61 is located on both the planar area 41 and the patterned area 42 of the second transitional layer 40. The first semiconductor layer 61 receives the first part 52 therein and is spaced from the second part 53 by gaps 51 (better seen in FIG. 2). In this embodiment, the epitaxial layer 60 is made of GaN, the first semiconductor layer 61 is an N-type GaN layer, the light emitting layer 62 is a MQW GaN layer, and the second semiconductor layer 63 is a P-type GaN layer. The second semiconductor layer 63 consists of a P-type blocking layer 631 on the light emitting layer 62 and a P-type contacting layer 632 on the P-type blocking layer 631. In the embodiment, the P-type blocking layer 631 is made of AlGaN and the P-type contacting layer 632 is made of GaN.

Figure 8:
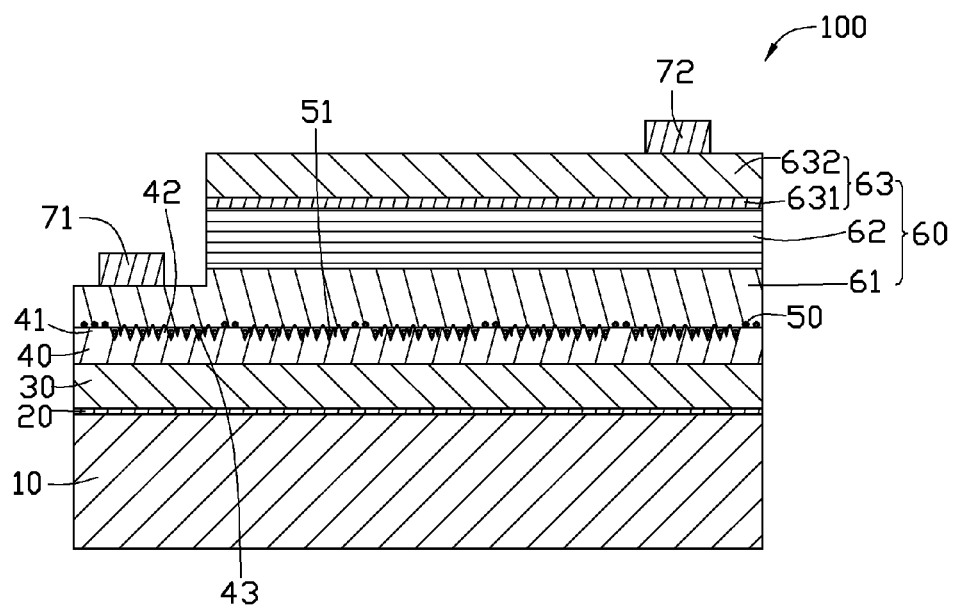
FIG. 8 is a cross-sectional view showing a step of forming two electrodes on an epitaxial layer of FIG. 7 to complete the formation of the LED of FIG. 1.

Referring to FIG. 8, a first electrode 71 and a second electrode 72 are respectively formed on the first semiconductor layer 61 and the second semiconductor layer 63. Vapor deposition or sputter can be used to form the first and the second electrodes 71, 72. Moreover, the first electrode 71 and second electrode 72 can be titanium, aluminum, silver, nickel, tungsten, copper, palladium, chromium, gold or an alloy thereof.

Furthermore, for providing an inducting current evenly flowing into the LED 100, a transparent conductive layer (not shown) can be disposed between the second electrode 72 and the second semiconductor layer 63. The transparent conductive layer can be made of ITO or Ni/Au alloy.

The LED 100 includes the first and second transitional layers 30, 40 and the AN material 50 consisting of a plurality of spheres and slugs disposed on/in the second transitional layer 40. When radiant light emitted downwardly from the light emitting layer 62 reaches the second transitional layer 40, since the surface of each sphere of the first part 52 of the AlN material 50 is curved, the radiant light reflected from the first part 52 has a lager incident angle to direct into the first semiconductor layer 61. Therefore, total reflections inside the LED 100 can be increased that the light extraction and the light intensity of the LED 100 are enhanced further. Furthermore, when the radiant light emitted downwardly from the light emitting layer 62 reaches the patterned area 42, since the second part 53 in the grooves 43 is spaced from the first semiconductor layer 61 by the gaps 51 which are filled with air, and since a refractivity of GaN (n=2.4) is quite large than a refractivity of the air (n=1.0), the radiant light is easier to be totally reflected at an interface of the first semiconductor layer 61 and the air, whereby the light extraction efficiency of the LED 100 is further increased.

That is, in the patterned area 42 of the second transitional layer 40, at least one groove 43 which has a slug of the second part 53 of AlN material 50 therein is located between two spheres of the first part 52 of AlN material 50, radiant light emitted downwardly from the light emitting layer 62 to the substrate 10 is easier to be totally reflected to the light output top surface of the LED 100, and an increase in intensity of the output light of the LED 100 is obtained. Furthermore, the uniformity of the output light of LED 100 can be improved by the arrangement of the spheres and slugs of the first and second parts 52, 53 of the AN material 50.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED (light emitting diode), comprising:
   a substrate;
   an epitaxial layer being disposed on the substrate;

a transitional layer being formed between the substrate and the epitaxial layer, the transitional layer comprising a planar area with a flat top surface and a patterned area with a rugged top surface, the epitaxial layer contacting the planar area and the patterned area of the transitional layer; and an AlN (aluminum nitride) material being disposed between the epitaxial layer and the transitional layer, the AlN material comprising a first part formed on the planar area and the patterned area of the transitional layer and a second part in the patterned area of the transitional layer, the first part consisting of a plurality of masses separated from each other and the second part consisting of a plurality of slugs separated from each other and from the masses of the first part of the AlN material.

2. The LED of claim 1, wherein the patterned area is arranged alternately with the planar area, the patterned area having a plurality of grooves, each of the grooves receiving the second part of the AlN material therein.

3. The LED of claim 2, wherein a plurality of gaps are formed between the second part of the AN material in the grooves and the epitaxial layer, each gap being filled with air.

4. The LED of claim 1, further comprising an additional transitional layer, wherein the additional transitional layer is sandwiched between the transitional layer and the substrate.

5. The LED of claim 4, further comprising a buffer layer, wherein the buffer layer is formed on a top surface of the substrate, the additional transitional layer being formed on a top surface of the buffer layer.

6. The LED of claim 4, wherein the transitional layer and the additional transitional layer are made of un-doped GaN (gallium nitride) or n-type GaN material.

7. The LED of claim 4, wherein the epitaxial layer comprises a first semiconductor layer, a light emitting layer and a second semiconductor layer sequentially disposed on the transitional layer.

8. The LED of claim 7, wherein the second semiconductor layer comprises a P-type blocking layer on the light emitting layer and a P-type contacting layer on the P-type blocking layer.

9. The LED of claim 7, wherein a first electrode is disposed on the first semiconductor layer and a second electrode is disposed on the second semiconductor layer.

10. The LED of claim 9, wherein the first electrode is disposed on a portion of the first semiconductor layer exposed upwardly to a top light output surface of the LED.

11. The LED of claim 1, wherein the substrate is sapphire ($Al_2O_3$), silicon carbide (SiC), silicon or gallium nitride (GaN).

12. The LED of claim 1, wherein the masses of the first part of the AlN material each are spherical, pyramid or cylindrical.

13. A manufacturing method for an LED (light emitting diode) comprising following steps:
    providing a substrate;
    disposing a transitional layer on the substrate, the transitional layer comprising a planar area with a flat top surface and a patterned area with a rugged top surface;
    coating an aluminum layer on the transitional layer;
    using a nitriding process on the aluminum layer to form an AlN material on the transitional layer, the AlN material having first part located on the planar area and the patterned area and second part located in the patterned area, the first part consisting of the a plurality of separated masses each being spherical, pyramid or cylindrical, the second part consisting of a plurality of slugs;
    disposing an epitaxial layer on the transitional layer and covering the AlN material, the epitaxial layer contacting the planar area and the patterned area of the transitional layer, a plurality of gaps being defined between the epitaxial layer and the slugs of the second part of the AlN material in the patterned area of the transitional layer.

14. The manufacturing method for an LED of claim 13, wherein the step of forming an epitaxial layer comprises disposing a first semiconductor layer, a light emitting layer and a second semiconductor layer sequentially on the transitional layer, and the step of forming an epitaxial layer further comprises forming a first electrode on the first semiconductor layer and a second electrode on the second semiconductor layer.

15. The manufacturing method for an LED of claim 13, further comprising disposing an additional transitional layer between the substrate and the transitional layer.

16. The manufacturing method for an LED of claim 15, wherein the transitional layer is formed under a temperature of 1000 to 1200 degrees centigrade, and the additional transitional layer is formed under a temperature of 750 to 900 degrees centigrade.

17. The manufacturing method for an LED of claim 15, wherein the epitaxial layer is formed under a temperature of 1000 to 1200 degrees centigrade.

18. The manufacturing method for an LED of claim 13, wherein a thickness of the aluminum layer is 500 A.

19. The manufacturing method for an LED of claim 13, wherein the patterned area and the planar area are arranged alternately, the patterned area comprising a plurality of grooves.

20. The manufacturing method for an LED of claim 19, wherein each groove receives a corresponding slug of the second part of the AlN material therein, the gaps each being formed between the AN material in a corresponding groove and the epitaxial layer.

* * * * *